United States Patent [19]
Lam

[11] Patent Number: 6,021,066
[45] Date of Patent: Feb. 1, 2000

[54] NVRAM ARRAY ARCHITECTURE UTILIZING COMMON BITLINE AND WORDLINE

[75] Inventor: Chung H. Lam, Williston, Vt.

[73] Assignee: International Business Machines Corporation, Armonk, N.Y.

[21] Appl. No.: 09/224,827

[22] Filed: Jan. 4, 1999

[51] Int. Cl.[7] .................................................. G11C 14/00
[52] U.S. Cl. .............................. 365/185.08; 365/185.05; 365/185.11
[58] Field of Search ................... 365/185.05, 185.08, 365/185.11, 185.17, 63

[56] References Cited

U.S. PATENT DOCUMENTS

| | | | |
|---|---|---|---|
| 4,703,456 | 10/1987 | Arakawa | 365/185.08 |
| 5,065,362 | 11/1991 | Herdt et al. | 365/185.07 |
| 5,189,641 | 2/1993 | Arakawa | 365/185.08 |
| 5,245,570 | 9/1993 | Fazio et al. | 365/230.03 |
| 5,267,196 | 11/1993 | Talreja et al. | 365/230.03 |
| 5,598,367 | 1/1997 | Noble | 365/149 |
| 5,627,784 | 5/1997 | Roohparvar | 365/189.01 |
| 5,631,864 | 5/1997 | Briner | 365/185.05 |
| 5,646,429 | 7/1997 | Chevallier | 257/316 |
| 5,880,991 | 3/1999 | Hsu et al. | 365/182 |

FOREIGN PATENT DOCUMENTS 6-61452  3/1994  Japan .

OTHER PUBLICATIONS

Pein et al., "Permormance of the 3–D Pencil Flash EPROM Cell and Memory Array", IEEE Transactions on Electron Devices, vol. 42, No. 11, Nov. 1995, pp. 1982–1984.

Pein et al., "A 3–D Sidewall Flash EPROM Cell and Memory Array", IEEE, vol. 14, No. 8, 1993.

"Common–Wordline Compact Merged DRAM Cell", IBM Technical Disclosure Bulletin, vol. 34, No. 6, Nov. 1991.

"Flash Memory Goes Mainstream", IEEE Spectrum, Oct. 1993.

*Primary Examiner*—Son T. Dinh
*Attorney, Agent, or Firm*—Whitham, Curtis & Whitham; Robert A. Walsh

[57] ABSTRACT

A non-volatile random access memory (NVRAM) array and chip architecture. An NVRAM array formed of at least two sub-arrays of pairs of NVRAM cells, each including three FETs stacked in a NAND-like structure. Each pair shares a bit line and a word line and each cell has a separate control gate and source gate from the other cell of the pair. For each sub-array, one cell in each pair us connected to a first control gate and source gate and the other cell in each pair is connected to another control gate and source gate. After sequentially accessing part or all of the cells on one source gate or one control gate in one sub-array, sequential access continues in another sub-array before accessing cells on the other source gate or control gate in the other sub-array. Selecting cells in one sub-array (i.e. driving a source gate or control gate) occurs as previously selected cells in another sub-array are accessed.

6 Claims, 3 Drawing Sheets

NVRAM ARRAY ARCHITECTURE UTILIZING COMMON BITLINE AND WORDLINE

RELATED APPLICATION

The present invention is related to U.S. patent application Ser. No. 09/100,729 (Attorney Docket No. BU9-97-189) entitled "Two Square NVRAM Cell" to Chung H. Lam, assigned to the assignee of the present application.

BACKGROUND OF THE INVENTION

1. Field of the Invention

The present invention generally relates to non-volatile memory chips and more particularly to an architecture for a three-dimensional, direct-write non-volatile random access memory (NVRAM).

2. Background Description

Non-volatile floating gate memory cells, such as in a non-volatile random access memory (NVRAM) are well known in the industry. In such NVRAM cells, the cell's conductive state is determined by the charge state of the cell's floating gate. The floating gate is an electrically isolated gate of a field effect transistor (FET) stacked in a two device NAND-like structure. Charge is forced onto or removed from the floating gate through a thin insulator layer that, normally (during a read operation), isolates the gate electrically from other adjoining conductive layers. Typically, a negatively charged floating gate is representative of a binary one state, while an uncharged floating gate is representative of a binary zero state.

The other device in the NAND-like structure is connected to a wordline and a bitline and provides for selective cell read and write selection. In typical state of the art designs, adjacent cells are connected to a common bitline. The wordlines of these adjacent cells must be uniquely addressable and physically distinct.

For writing cells, a control gate (or program gate) is capacitively coupled to floating gates of cells in a portion of an array. A program voltage placed on a control gate biases the floating gate of cell connected to the control gate sufficiently to change the charge on the cell's floating gate, i.e. to write selected cells.

Normally, to write data into a prior art memory cell, the cell must first be erased and then written. Each of these operations may require one or more machine cycles, e.g., 10 milliseconds, and each requires a significantly higher external voltage supply, such as 15–20 volts. Special decoder circuits are used to provide these higher than normal voltages to the cells.

It is a normal design goal to minimize cell size, thereby maximizing cell density. However, memory designers have not achieved a state of the art unit cell that is smaller than 6–8 squares, where a square is the smallest unit design area for a given technology, e.g., 0.2 $\mu$m×0.2 $\mu$m. Any device fabrication technique improvements that produce a denser memory array and reduce chip power requirements.

Thus, there is a need for smaller, denser NVRAM array and NVRAM chips.

SUMMARY OF THE INVENTION

It is therefore a purpose of the present invention to reduce NVRAM cell size without impacting NVRAM performance.

It is another purpose of the present invention to increase the number of NVRAM cells that may be included on a single integrated circuit chip without impacting NVRAM performance.

The present invention is a non-volatile random access memory (NVRAM) array and chip architecture. An NVRAM array formed of at least two sub-arrays of pairs of NVRAM cells, each including three FETs stacked in a NAND-like structure. Each pair shares a bit line and a word line and each cell has a separate control gate and source gate from the other cell of the pair. For each sub-array, one cell in each pair is connected to a first control gate and source gate and the other cell in each pair is connected to another control gate and source gate. After sequentially accessing part or all of the cells on one source gate or one control gate in one sub-array, sequential access continues in another sub-array before accessing cells on the other source gate or control gate in the other sub-array. Selecting cells in one sub-array (i.e. driving a source gate or control gate) occurs as previously selected cells in another sub-array are accessed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
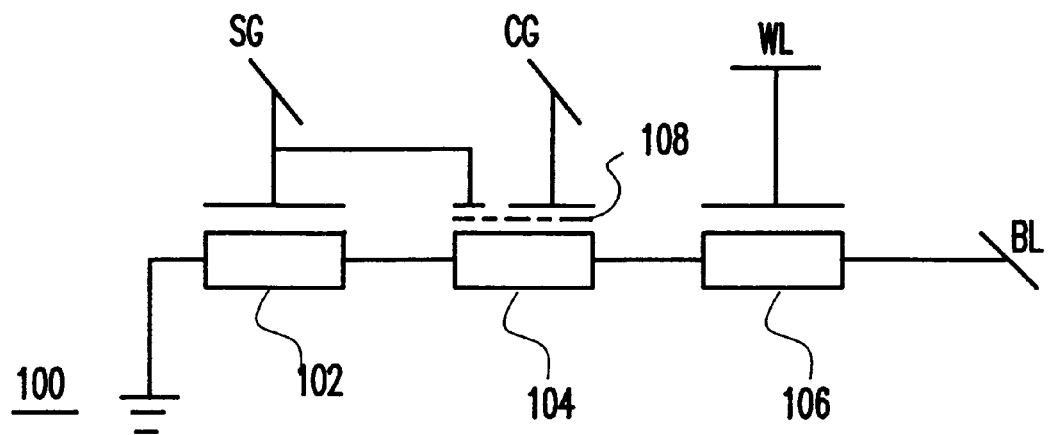
FIG. 1A shows a schematic of a preferred non-volatile random access memory (NVRAM) cell.

Referring now to the drawings, and more particularly to FIG. 1A which shows a schematic of a single preferred non-volatile random access memory (NVRAM) cell 100. Three FETs 102, 104 and 106 are stacked in a NAND-like structure. Source device 102, which is connected between ground and floating gate device 104, has its gate tied to a source gate (SG) line. Word line select device 106 is connected between a bit line (BL) and floating gate device 104 and has its gate tied to a passing word line (WL). Control gate (CG) line and SG are capacitively coupled to the floating gate (represented by dashed line 108) of each floating gate device 104.

Figure 1B:
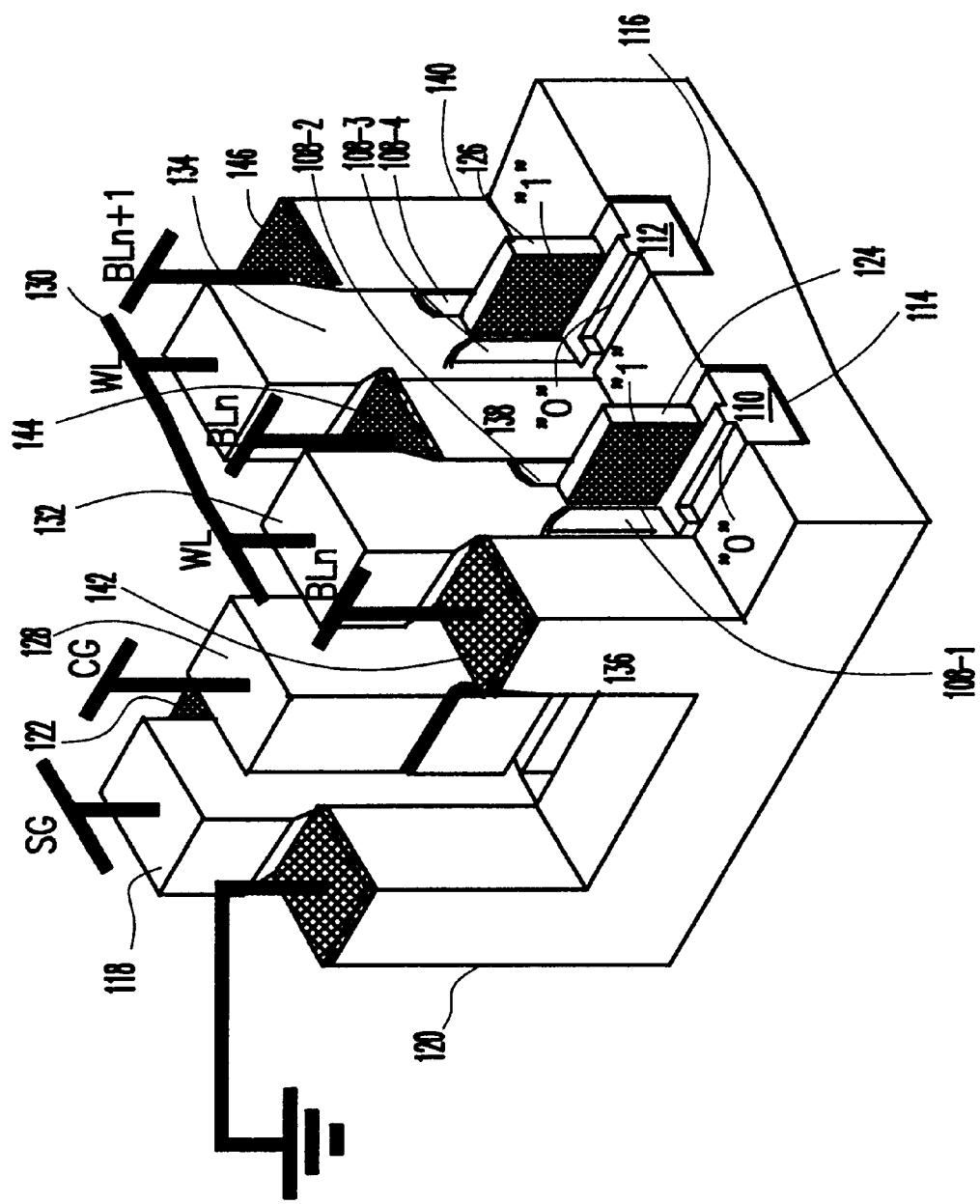
FIG. 1B shows is a cross-sectional view of a portion preferred embodiment array of cells of FIG. 1A.

As can be seen from FIG. 1B, which is a cross-sectional view of a portion of a preferred embodiment array, unlike prior art NVRAM cells, adjacent pairs of preferred NVRAM cells 100 share a common wordline (WL) and a common bitline (BL). In FIG. 1B, source gate lines 110 and 112 each extend along the bottom of a trench 114 and 116, respectively. Each source gate line 110 and 112 is driven from one end by a source gate contact pillar 118 (only source gate pillar 118 connected to source gate device 110 is shown in FIG. 1B).

A diffusion (not shown) along the bottom of each trench 114, 116 is the source diffusion of each source device 102 along the trench 114, 116. Ground is supplied to the diffusion through sidewall FETs in pillars 120, 122 gated on opposite sides of adjacent source gate contact pillars 118.

Planar control gate lines 124, 126 are collinear with and immediately above source gate lines 110, 112, respectively. Each control gate line 124, 126 is coupled to a pair of floating gates 108-1, 108-2 and 108-3, 108-4, respectively. As with the source gate lines 110 and 112, the planar control gate lines 124, 126 are driven from one end by control gate contact pillar 128.

For the preferred embodiment, each word line 130 is connected to word line plugs 132, 134. Each word line plug 132, 134 extends upwards between two pillars 136, 138 and 140, at least slightly overlaps of floating gate pairs 108-1, 108-2 and 108-3, 108-4, respectively. Thus, each word line plug 132, 134 is the gate of a pair of word line select devices 106. Bit line contacts 142, 144 and 146 at the top of each pillar 136, 138 and 140 are shared by pairs of adjacent cells, as represented in FIG. 1B, particularly, by pillar 138 and bit line contact 144.

During a read, each cell is selected, individually, by the cell's word line 130 being high coincidentally with the cell's source gate line 110 or 112 being high. During a write, each cell is selected, individually, by the cell's word line 130 being high coincidentally with the cell's control gate line 124 or 126 being high. The table below is an example of voltages on the terminals of a preferred embodiment NVRAM cell during READ and WRITE operations.

Thus, for example, when control gate 110 is high and word line 130 is driven high, data from the cells represented by floating gate pair 108-1 and 108-2 is provided to bit lines 142 and 144, respectively. Alternately, when control gate 112 is high and word line 130 is driven high, data from the cells represented by floating gate pair 108-3 and 108-4 is provided to bit lines 144 and 146, respectively. A write may be done without first erasing the cell.

|              | READ | WRITE    |
|--------------|------|----------|
| Bit line     | 1V   | "0" = 0V |
|              |      | "1" = 3V |
| Word line    | 3V   | 3V       |
| Control Gate | 0V   | 12V      |
| Source Gate  | 3V   | 0V       |

The preferred embodiment NVRAM cell and method of forming the cells is provided in U.S. patent application Ser. No. 09/100,729 (Attorney Docket No. BU9-97-189) entitled "Two Square NVRAM Cell" to Chung H. Lam, assigned to the assignee of the present application and incorporated herein by reference.

Figure 2:
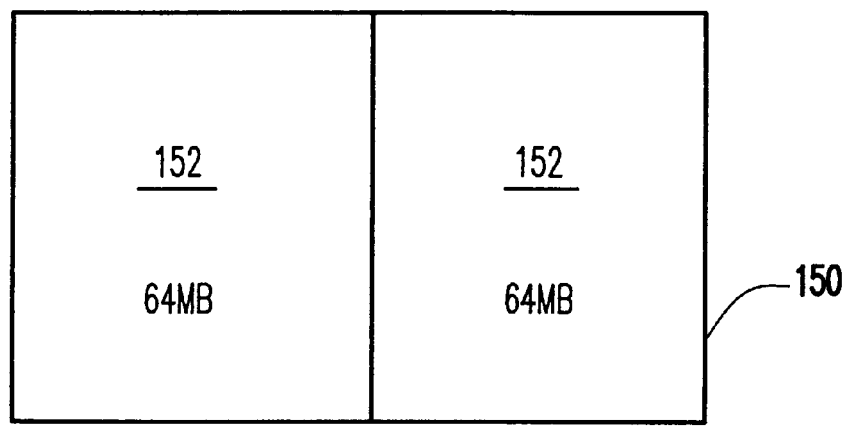
FIG. 2 shows a block diagram a preferred embodiment NVRAM array.
Figure 3:
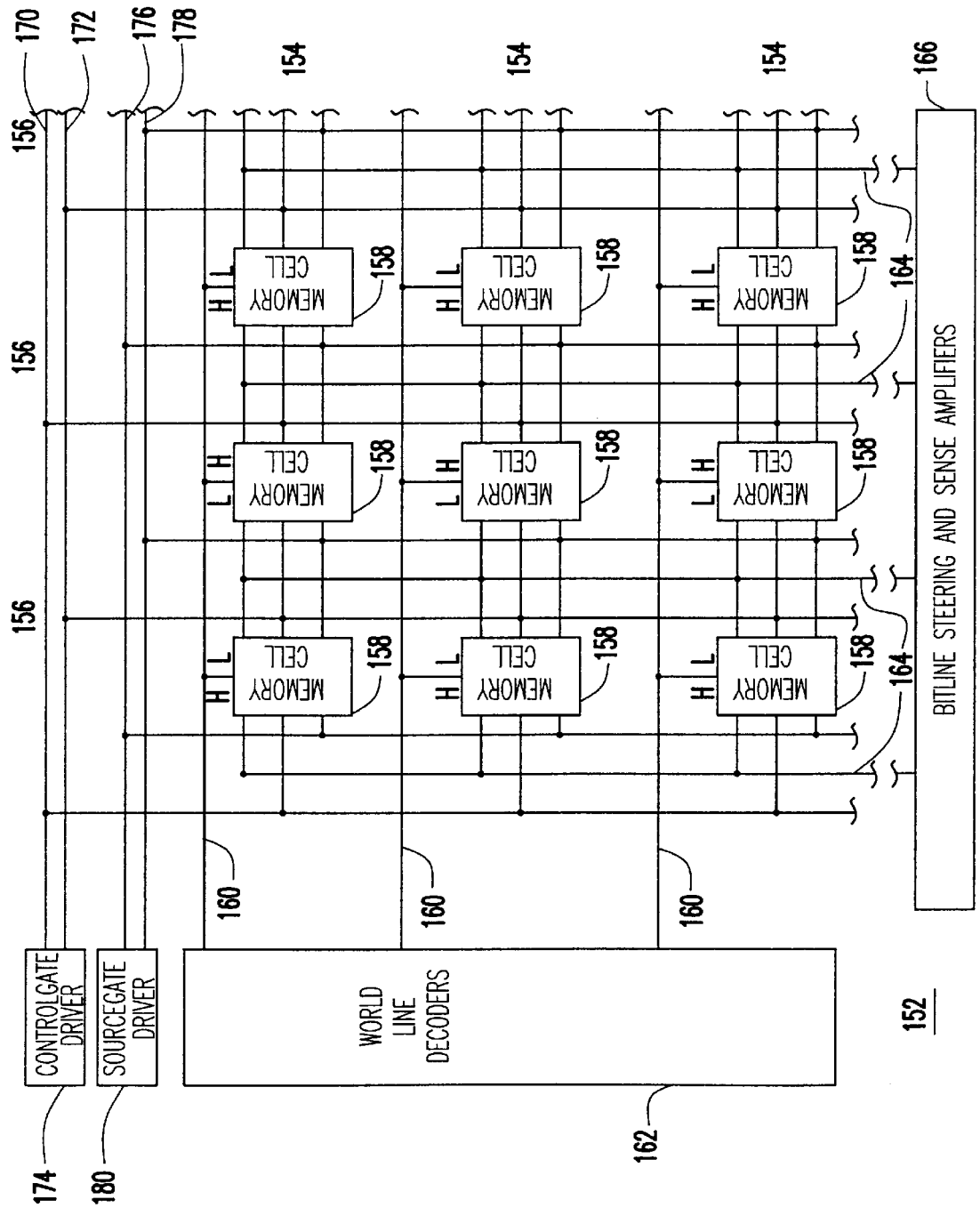
FIG. 3 is a schematic of a preferred embodiment sub-array organization and cell decode for a sub-array of NVRAM cells.

Referring now to FIG. 2, an array 150 of the preferred embodiment NVRAM chip includes multiple sub-arrays 152. As the schematic of FIG. 3 shows, each sub-array 152 includes rows 154 and columns 156 of pairs of cells 158 connected to a word line 160. Each word line 160 is selected by word line decoder 162. Bit lines 164 are passed to bit line steering (for individual bit line selection) and sense amplifiers in block 166. Any suitable word line decoder 162 may be used depending on the number of word lines selected for each sub-array 152. Further, any suitable sense amplifier and any suitable bit switch scheme may be used for cell pair selection.

In the preferred embodiment array, in addition to word line 162 and bit line 166 selection, an additional cell selection is made in each sub-array 152 to selectively enable one cell 100 in each pair of cells. Thus, cells in each pair may be labeled high and low, odd and even, or any other desired label may be selected. As used herein, individual cells in a pair are referred to as high and low. A pair of control gate lines 170, 172, selected by a Control Gate Drive 174, selectively enable the high or low cells in each pair during a read. A pair of source gate lines 176, 178, selected by a Source Gate Drive 180, selectively enable the high or low cells in each pair during a write. Thus, only one of the two control gate lines 170 or 172 are driven high in any single write operation. Otherwise, both control gate lines 170 and 172 remain low. Likewise, during any given read, only one source gate line 176 or 178 is driven high. Otherwise, both source gate lines 176 and 178 remain low.

Typically, each control gate line 170, 172 and each source gate line 176, 178 is distributed resistance with a large distributed capacitance. This large distributed capacitance is due to the intentional coupling of these lines to floating gates. As a result of this distributed RC, there is a long propagation delay between initiating source gate selection, i.e., driving contact pillar 118 or 128 high and the time when all selected cells, including those at the opposite end of the line being driven, have been enabled. This propagation delay may be more than 6 $\mu$s for a state of the art semiconductor process.

Therefore, for optimum performance, H or L cells in one sub-array are enabled concurrently with H or L cells in another sub-array being accessed. By restricting sequential cell accesses to no more than half of the cells, H or L, in one sub-array, the cell enablement propagation delay may be completely or nearly completely hidden so as to avoid impacting effective array performance.

Thus, for example, after accessing all low cells in a first sub-array, high or low cells in another sub-array are accessed before accessing the high cells in the first sub-array. By selecting an appropriate sub-array size, depending on cell access time, the enabling propagation delay may be designed such that completion of accessing H or L cells in each sub-array coincides with enabling the H or L cells in another sub-array.

While the invention has been described in terms of preferred embodiments, those skilled in the art will recognize that the invention can be practiced with modification within the spirit and scope of the appended claims.

I claim:

1. A non-volatile random access memory (NVRAM) comprising:

an array including a plurality of sub-arrays, each of said sub-arrays including a plurality of pairs of NVRAM cells, each of said pairs of NVRAM cells comprising:
a pair of word line select devices connected at a first conduction terminal to a bit line and gated by a word line,
a pair floating gate devices, each of said pair of floating gate devices connected at a first conduction terminal to a second conduction terminal of one of said pair of word line devices,
a first control gate capacitively coupled to a floating gate of a first of said pair of floating gate devices and a second control gate capacitively coupled to a floating gate of the second of said pair of floating gate devices, and
a pair of source devices each having a first conduction terminal connected to a second conduction terminal of one of said pair of floating gate devices; and
a pair of source lines connected to each of said sub-arrays, a first of each said pair of source lines gating first ones of said pair of source devices in each of said plurality of pairs of NVRAM cells in said sub-array and the second of said pair of source lines gating second ones of said pair of source devices in each of said plurality of pairs of NVRAM cells in said sub-array.

2. The NVRAM of claim 1, further comprising:

a pair of control gate lines connected to each of said sub-arrays, a first of each said pair of control gate lines connected to first control gates in each of said plurality of pairs of NVRAM cells in said sub-array and the second of said pair of control gate lines connected to second control gates in each of pairs of NVRAM cells.

3. The NVRAM of claim 1, further comprising:

a word line decoder for selectively driving word lines; and means for selectively driving each said pair of source lines.

4. The NVRAM of claim 2, further comprising:

a word line decoder for selectively driving word lines;

means for selectively driving each said pair of control gate lines; and means for selectively driving each said pair of source lines.

5. The NVRAM of claim 4, wherein said means for selectively driving each said pair of source lines concurrently drives two source lines in different pairs of source lines.

6. The NVRAM of claim 5, wherein the word line decoder is a word line decoder in each of said sub-arrays and a first of said concurrently driven two source lines is being driven active in one of said sub-arrays and the second is being held active and selecting cells in combination with said word decoder in said sub-array.

* * * * *